United States Patent
Vyvoda

(10) Patent No.: US 6,825,533 B2
(45) Date of Patent: Nov. 30, 2004

(54) INVERTED STAGGERED THIN FILM TRANSISTOR WITH ETCH STOP LAYER AND METHOD OF MAKING SAME

(75) Inventor: Michael A. Vyvoda, San Jose, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 0 days.

(21) Appl. No.: 10/756,356

(22) Filed: Jan. 14, 2004

(65) Prior Publication Data

US 2004/0145005 A1 Jul. 29, 2004

Related U.S. Application Data

(62) Division of application No. 10/270,309, filed on Oct. 15, 2002, now Pat. No. 6,710,409.

(51) Int. Cl.[7] .......... H01L 27/01; H01L 27/12; H01L 31/0392; H01L 29/788; H01L 29/792
(52) U.S. Cl. .......... 257/350; 257/67; 438/155; 438/158
(58) Field of Search .......... 257/67, 69, 347, 257/350, 351; 438/151, 155, 157, 158

(56) References Cited

U.S. PATENT DOCUMENTS

| | | | |
|---|---|---|---|
| 5,306,935 A | 4/1994 | Esquivel et al. | |
| 5,610,082 A | 3/1997 | Oh | |
| 5,614,728 A | 3/1997 | Akiyama | |
| 5,936,280 A | * 8/1999 | Liu | 257/347 |
| 6,185,122 B1 | 2/2001 | Johnson et al. | |
| 6,504,182 B2 | 1/2003 | Green et al. | |
| 6,525,379 B2 | * 2/2003 | Nomoto et al. | 257/347 |
| 6,627,953 B1 | * 9/2003 | Vu et al. | 257/347 |
| 6,646,307 B1 | * 11/2003 | Yu et al. | 257/347 |
| 2001/0055838 A1 | 12/2001 | Walker et al. | |
| 2002/0028541 A1 | 3/2002 | Lee et al. | |
| 2003/0094616 A1 | 5/2003 | Andry et al. | |

* cited by examiner

Primary Examiner—Ngân V. Ngô
(74) Attorney, Agent, or Firm—Foley & Lardner LLP

(57) ABSTRACT

A semiconductor device contains a word line, a charge storage region located above the word line, an active layer located above the charge storage region, a patterned etch stop layer located above a first portion of the active layer, and bit lines located over a portion of the etch stop layer and over second portions of the active layer.

14 Claims, 3 Drawing Sheets

US 6,825,533 B2

INVERTED STAGGERED THIN FILM TRANSISTOR WITH ETCH STOP LAYER AND METHOD OF MAKING SAME

This application is a Divisional of Ser. No. 10/270,309 filed Oct. 15, 2002, now U.S. Pat. No. 6,710,409.

FIELD OF THE INVENTION

The present invention is directed generally to semiconductor devices and methods of fabrication and more particularly to a charge storage thin film transistor array and method of fabrication.

BACKGROUND OF THE INVENTION

U.S. published application 20020028541 which was filed as U.S. application Ser. No. 09/927,648, on Aug. 13, 2001 and which is incorporated by reference in its entirety, discloses a monolithic three dimensional array of charge storage devices. In one embodiment in this application, the charge storage devices of the array comprise both top gate staggered and inverted (i.e., bottom gate) staggered thin film transistors. Thin film transistors are called "staggered" when the gate electrode is located on the opposite side of the active layer from the source and drain electrodes. In the inverted staggered thin film transistors, the active layer and the bit lines were both made of polysilicon, and the bit lines were deposited in narrow vias in an isolation layer and then planarized to the top of the isolation layer. While deposition of a polysilicon layer to fill narrow vias is within the skill of those in the art, this deposition step is more difficult than the deposition of a polysilicon layer on a surface.

BRIEF SUMMARY OF THE INVENTION

A preferred embodiment of the present invention provides a semiconductor device, comprising a word line, a charge storage region located above the word line, an active layer located above the charge storage region, a patterned etch stop layer located above a first portion of the active layer, and bit lines located over a portion of the etch stop layer and over second portions of the active layer.

Another preferred embodiment of the present invention provides a monolithic, three dimensional array of thin film transistors, comprising a first device level comprising a plurality of first inverted staggered thin film transistors, and a second device level monolithically formed over the first device level, the second device level comprising a plurality of second thin film transistors. The first inverted staggered thin film transistors comprise a first etch stop layer located over transistor channel regions.

Another preferred embodiment of the present invention provides an array of inverted staggered thin film transistors, comprising a plurality of gate lines, a planarized insulating fill layer located between the gate lines, a gate insulating layer located on the fill layer and on exposed portions of the gate lines, an active layer located on the gate insulating layer, a patterned etch stop layer located on first portions of the active layer, and a plurality of source and drain lines located on second portions of the active layer and on portions of the patterned etch stop layer.

Another preferred embodiment of the present invention provides a method of making semiconductor device, comprising forming a first gate line layer, patterning the first gate line layer to form a plurality of first gate lines, forming a first insulating fill layer over and between the first gate lines, planarizing the first fill layer with a top surface of the first gate lines, forming a first gate insulating layer over the first gate lines and the first fill layer, forming a first active layer over the first gate insulating layer, and forming a first etch stop layer over the first active layer. The method further comprises selectively patterning the first etch stop layer such that first portions of the first active layer are covered by the etch stop layer and second portions of the first active layer are exposed, forming a first source/drain line film over the first patterned etch stop layer and the exposed second portions of the first active layer, and selectively patterning the first source/drain line film to form first source and drain lines and to expose portions of the first patterned etch stop layer between the first source and drain lines.

DETAILED DESCRIPTION OF THE PREFERRED EMBODIMENTS

The present inventor has realized that the method of forming bit lines of the inverted staggered transistors may be simplified if a patterned etch stop layer is first formed on the active layer. Thus, even if the bit lines and the underlying active layer are both made of the same material, such as polysilicon, the etch stop layer prevents over etching of the active layer when the bit lines are patterned.

Figure 1:
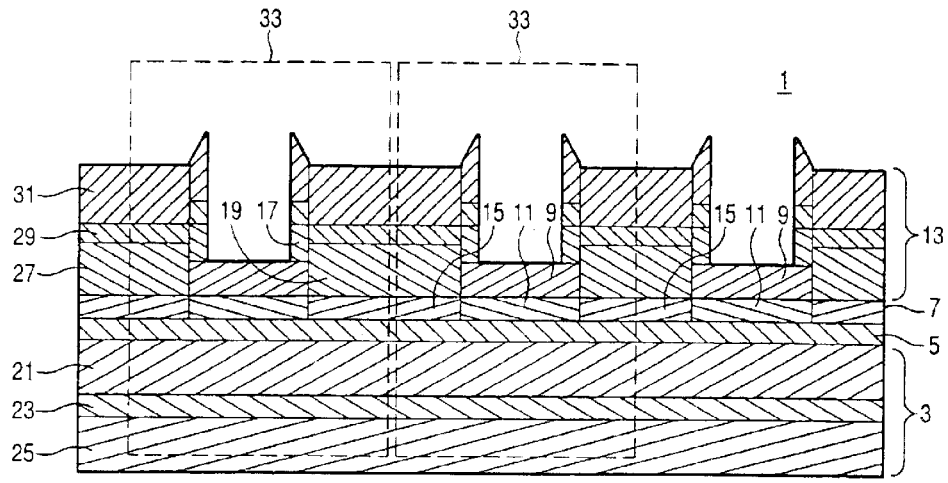
FIG. 1 is a side cross sectional view of an array of thin film transistors according to the first preferred embodiment of the present invention.

FIG. 1 illustrates a two dimensional array 1 of inverted staggered thin film transistors with a charge storage region and an etch stop layer according to a first preferred embodiment of the present invention. The array 1 includes a word line 3, a charge storage region 5 located above the word line 3, an active layer 7 located above the charge storage region 5, a patterned etch stop layer 9 located above first portions 11 of the active layer 7 and bit lines 13 located over portions of the etch stop layer 9 and over second portions 15 of the active layer 7.

Preferably, the charge storage region 5 is located directly on the word line 3 and the active layer 7 is located directly on the charge storage region 5. The first portions 11 of the active layer 7 are semiconductor transistor channel regions of a first conductivity type (i.e., p or n-type). The second portions 15 of the active layer 7 are semiconductor transistor source and drain regions of a second conductivity type (i.e., n or p-type).

The patterned etch stop layer 9 is located on the channel portions 11 of the active layer 7 but not on the source or drain portions 15 of the active layer 7. An edge portion 17 of the bit lines 13 is located on the etch stop layer 9 and a middle portion 19 of the bit lines 13 is located on the respective source and drain regions 15.

The word line 3, charge storage region 5, active layer 7, etch stop layer 9 and bit lines 13 may comprise any suitable materials. The word line 3 may comprise any suitable conductive material. Preferably, the word line 3 comprises a first heavily doped polysilicon layer 21 over a metal silicide layer 23. If desired, a second heavily doped polysilicon layer 25 may be located below the metal silicide layer 23. Alternatively, the suicide layer 23 may be eliminated to reduce processing cost or replaced with another conductive layer or film, such as a titanium silicide/titanium nitride film or a titanium nitride/tungsten/titanium nitride film.

The charge storage region 5 comprises either a dielectric isolated floating gate, an insulating layer containing conductive nanocrystals or a composite dielectric film comprising a tunneling layer, a charge storage layer and a blocking oxide. For example, the charge storage region 5 may comprise a polysilicon floating gate between a tunneling silicon oxide and a blocking silicon oxide layers. Alternatively, the charge storage region may comprise a silicon dioxide layer with aluminum or other metal nanocrystals, as disclosed in U.S. published application 20020028541, incorporated herein by reference in its entirety. Alternatively, the charge storage region may comprise the composite dielectric film comprising a silicon oxide tunneling layer, a silicon nitride or oxynitride charge storage layer and a blocking silicon oxide layer.

The active layer 7 may comprise any semiconductor layer, preferably polysilicon or amorphous silicon. The source and drain regions 15 preferably comprise heavily doped semiconductor regions in the active layer 7.

The bit lines 13 may comprise any suitable conductive material. Preferably, the bit lines 13 comprise a first polysilicon layer 27 contacting the source and drain regions 15 and a conductivity enhancing film 29 contacting the first polysilicon layer 27. Film 29 may comprise a metal silicide layer or a titanium silicide/titanium nitride bilayer, with the titanium nitride overlying the titanium silicide. If desired, a second heavily doped polysilicon layer 31 is located on the film 29. Alternatively, the titanium silicide/titanium nitride bilayer 29 may be eliminated to reduce processing cost or replaced with another conductive layer or film, such as a titanium nitride/tungsten/titanium nitride film.

The etch stop layer 9 comprises any material that can be selectively etched compared to the active layer 7 and the bit lines 13. For example, if the active layer and the bottom portion of the bit lines comprise the same material, such as polysilicon, then the etch stop layer is a different material that can be selectively etched compared to polysilicon. This means that polysilicon is selectively etched at a much higher rate than the etch stop material with a polysilicon specific etching gas or liquid, and the etch stop material is selectively etched at a much higher rate than polysilicon with an etch stop specific etching gas or liquid. The term "much higher" means at least two times higher and preferably at least four times higher. Preferably, the etch stop layer comprises a silicon oxide or a silicon oxynitride layer.

A portion of the bit lines 13, a portion of the word line 3, a portion of the charge storage region 5, the source, the drain 15 and the channel 11 regions comprise a first inverted staggered thin film transistor 33. The word line 3 acts as the gate electrode of the transistor 33 and the bit lines 13 act as source and drain electrodes. As shown in FIG. 1, the array 1 contains a plurality of adjacent transistors 33. Preferably, adjacent transistors 33 share a common bit line and a common source or drain region. However, if desired, adjacent transistors 33 may be separated by an isolation region, such as a trench filled by a dielectric material, and not share bit lines and source or drain regions.

The transistors 33 of the array 1 described with respect to FIG. 1 are charge storage transistors that are used in an erasable programmable read only memory (EPROM) or an electrically erasable programmable read only memory (EEPROM). However, if desired, the transistors may comprise transistors which do not store charge. These transistors differ from charge storage transistors in that the charge storage region 5 is replaced by a gate insulating layer or film. For example, the gate insulating layer or film may comprise a silicon oxide layer or a silicon oxide/silicon oxynitride bilayer. The transistors with a gate insulating layer may be used in complementary metal oxide semiconductor (CMOS) devices for logic (such as microprocessor) or memory (such as dynamic or static random access memory) applications. Accordingly, while for convenience in setting forth the preferred embodiments herein, the lines 3 are referred to as "word lines," they may be considered more generally as "gate lines," which term is intended to include such lines whether used in memory or non-memory arrays. Similarly, the term "bit lines" for the lines 13 is used herein for convenience, but these lines may be more generally referred to as "source/drain lines" or "source and drain lines" for both memory and non-memory applications of the present invention.

Figure 2:
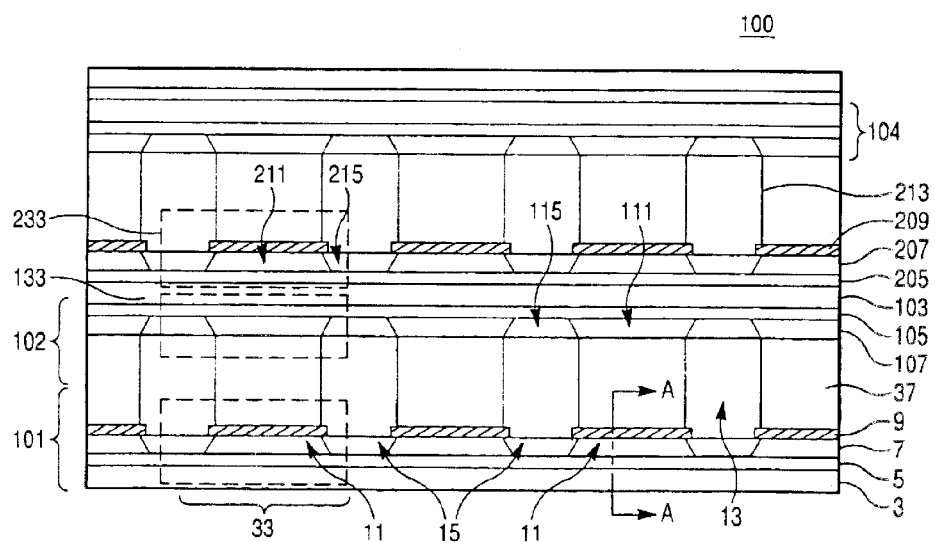
FIG. 2 is a side cross sectional view of an array of thin film transistors according to the second preferred embodiment of the present invention.

In a second preferred embodiment of the present invention, the array comprises a monolithic, three dimensional array of thin film transistors 100, as shown in FIG. 2. A first device level 101 comprises a plurality of first inverted staggered thin film transistors 33. The first inverted staggered thin film transistors 33 comprise a first etch stop layer 9 located over transistor channel regions 11. A second device level 102 is preferably monolithically formed over the first device level 101. The second device level 102 comprises a plurality of second thin film transistors 133. A device level is monolithically formed over a lower device level when it is deposited on the lower device level layer by layer, instead of the entire upper device layer being formed separately and then glued or bonded to the lower device layer.

Figure 3:
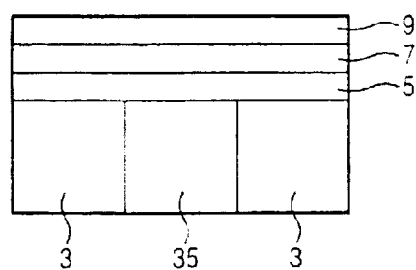
FIG. 3 is a side cross sectional view along line A-A' in FIG. 2.

FIG. 3 is a side cross sectional view along line A—A in FIG. 2. The array 100 contains a plurality of first gate lines 3 at a first height and extending in a first direction, as shown in FIG. 3. If the transistors are charge storage transistors used for memory application, then the gate lines are often referred to as word lines.

A first planarized insulating fill layer 35 is located between the first gate lines 3, as shown in FIG. 3. A first gate insulating layer 5 is located on the first gate lines and on the first insulating fill layer. If desired, layer 5 may comprise a portion of a charge storage region, as described above. The first active layer is 7 is located on the first gate insulating layer 5. The patterned etch stop layer 9 is located on channel regions 11 in the first active layer 7.

Turning back to FIG. 2, a plurality of a first source and drain lines 13 are located on source and drain regions 15 in the first active layer 7 and on portions of the patterned etch stop layer 9. The first source and drain lines 13 extend in a second direction different from the first direction. If transistors 33 are charge storage transistors for memory applications, then the source and drain lines are often referred to as bit lines, as described above.

A second planarized insulating fill layer 37 is located between the first source and drain lines 13. Preferably, the fill layers 35 and 37 comprise any insulating material, such as silicon oxide, silicon oxynitride, phosphosilicate glass (PSG), borophosphosilicate glass (BPSG), borosilicate glass (BSG), spin-on glass, a polymer dielectric layer (such as polyimide, etc.), and/or any other desired insulating material, such as a silicon oxide layer deposited by a high density plasma (HDP) method.

A second active layer 107 is located on the first source and drain lines 13 and fill layer 37. A second gate insulating layer 105 is located on the second active layer 107. A plurality of second gate lines 103 are located on the second gate insulating layer 105. The second gate lines 103 extend in the same direction as the first gate lines 3.

The array 100 contains a plurality of bottom gate staggered thin film transistors 33 and a plurality of top gate staggered thin film transistors 133. The channel 11, source and drain 15 regions of each first transistor 33 are located in a portion of the first active layer 7. A gate insulating region of each first transistor 33 is located in a portion of the first gate insulating layer 5. A gate electrode of each first transistor 33 is located in a portion of one of the first gate lines 3.

The channel 111, source and drain 115 regions of each second transistor 133 are located in a portion of the second active layer 107. The gate insulating region of each second transistor 133 is located in a portion of the second gate insulating layer 105. The gate electrode of each second transistor 133 is located in a portion of one of the second gate lines 103.

Thus, as shown in FIG. 2, the first 33 and the second 133 transistors share the first source and drain lines 13. The first device level 101 contains the first gate lines 3 and the first source and drain lines 13. The second device level 102 contains the second gate lines 103 and the first source and drain lines 13.

If desired, the array contains additional device levels. For example, a third gate insulating layer 205 is located on the second gate lines 103. A third active layer 207 is located on the third gate insulating layer 205. A second patterned etch stop layer 209 is located on the third active layer 207. A plurality of second source and drain lines 213 are located on the third active layer 207 and on the second patterned etch stop layer 209. The second source and drain lines 213 extend in the same direction as the first source and drain lines 13. Thus, a plurality of third inverted staggered thin film transistors 233 are located above the second top gate transistors 133.

As shown in FIG. 2, the second 133 and the third 233 transistors share the second gate lines 103. The channel 211, source and drain 215 regions of each third transistor 233 are located in a portion of the third active layer 207. A gate insulating region of each third transistor 233 is located in a portion of the third gate insulating layer 205. A gate electrode of each third transistor 233 is located in a portion of one of the second gate lines 103. The source and drain lines of each third transistor comprise the second source and drain lines 213.

If desired, additional device levels, such as level 104, may be formed in the array 100 as shown in FIG. 2. These device levels alternate the inverse staggered thin film transistors and top gate thin film transistors in the manner described above. The array 100 may have any desired number of levels, such as two to eight levels.

For EPROM or EEPROM applications, all transistors 33, 133, 233 are of the same conductivity type (i.e., p or n-type) and have a charge storage region. In an alternative embodiment of the invention, the array 100 is used for logic or random access memory application. In this embodiment, the first 33 and second 133 transistors preferably comprise metal oxide semiconductor transistors of a first conductivity type and the third transistors 233 comprise metal oxide semiconductor transistors of a second conductivity type. Thus, the transistors that share source and drain lines have the same conductivity type, while transistors which share gate lines have an opposite conductivity type. This makes it possible to form CMOS type logic or memory building blocks.

The present invention is not limited to the array 100 configuration shown in FIG. 2. Other array configurations, such as those described in U.S. published application 20020028541, incorporated herein by reference, may be used instead. For example, the array may contain only inverse staggered thin film transistors separated by an interlevel dielectric layer.

A method of making an array of thin film transistors according to the preferred embodiments of the present invention will now be described. A first gate line film is formed over a substrate. This film is photolithographically patterned to form a plurality of first gate lines 3, as shown FIGS. 3 and 4. For example, the gate line film may comprise a first heavily doped polysilicon layer 21 over a titanium/titanium nitride film 23 over a second heavily doped polysilicon layer 25, as shown in FIG. 1. The polysilicon layers 21 and 23 may be deposited as polysilicon layers or deposited as amorphous silicon layers and then converted to polysilicon layers upon annealing. Preferably, layer 21 is about 2000–3000 Angstroms thick and layer 25 is about 1000 to 3000 Angstroms thick. Layers 21 and 25 are preferably heavily P-type doped to a concentration of $1\times10^{19}$ to $5\times10^{21}$ cm$^{-3}$, preferably $1\times10^{20}$ to $5\times10^{21}$ cm$^{-3}$. Layers 21 and 25 may be doped in situ during deposition or by ion implantation after deposition. The titanium layer may be an about 100–500 Angstroms thick titanium layer deposited by physical vapor deposition (PVD) or ionized metal plasma PVD (IMP-PVD). The titanium nitride layer may be an about 100–200 Angstrom TiN layer deposited by PVD, IMP-PVD or metal organic chemical vapor deposition (MOCVD). However, any other suitable materials, deposition methods and layer thickness may be used instead. Preferably, the titanium layer reacts with the lower polysilicon layer 25 during a subsequent anneal to form a titanium silicide layer.

Figure 4:
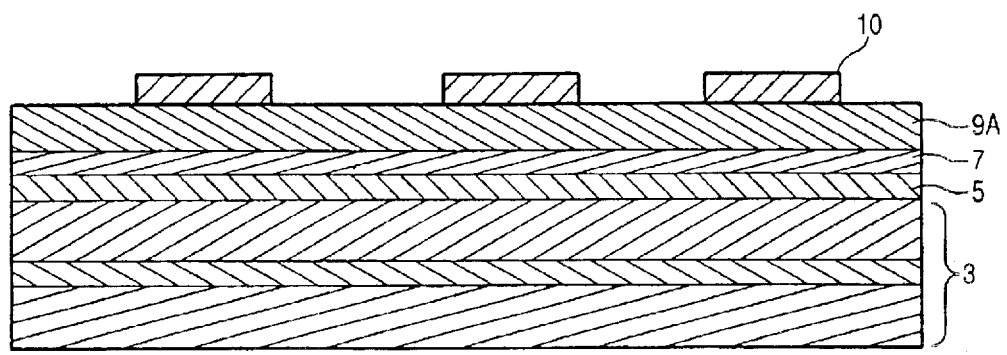
FIGS. 4 and 5 are side cross sectional views of steps in a method of making of the array of thin film transistors according to the first preferred embodiment of the present invention.

A first insulating fill layer 35 (see FIG. 3) is formed over and between the first gate lines 3. The first fill layer 35 is planarized with a top surface of the first gate lines 3 by chemical mechanical polishing or etchback. A first gate insulating layer 5 is formed over the first gate lines 3 and the first fill layer 35, as shown in FIGS. 3 and 4. Preferably, the gate insulating layer 5 comprises a portion of a ONO dielectric charge storage film (i.e., a stack of silicon oxide/silicon nitride or oxynitride/silicon oxide layers). The ONO dielectric film preferably comprises a tunnel silicon oxide, a charge storage $Si_3N_{4-x}O_{1.5x}$ layer, where x is 0 to 1, and a blocking silicon oxide. The tunnel oxide may have a thickness of 1.5 nm to 7 nm, preferably 2 nm to 3 nm. The charge storage silicon nitride or silicon oxynitride ($Si_3N_{4-x}O_{1.5x}$) layer may have a thickness of at least 4 nm, preferably 4–15 nm, most preferably 5 nm to 6 nm. The blocking oxide layer may have a thickness of 3 nm to 9 nm, preferably 3.5 nm to 4.5 nm. The ONO film may be deposited by chemical vapor deposition, physical vapor deposition and/or by chemical reaction with the upper gate line polysilicon layer 21 (i.e., by thermally oxidizing the polysilicon layer 21 to form the tunnel oxide).

A first active layer 7 is formed over the first gate insulating layer 5. The first active layer may be about 100–1000 Angstrom thick lightly doped polysilicon layer doped P-type to a concentration of $1\times10^{16}$ to $1\times10^{18}$ cm$^{-3}$, preferably below $5\times10^{17}$ cm$^{-3}$. Layer 7 may be doped by ion implantation after deposition or in-situ doped during deposition. A first etch stop layer 9A is formed over the first active layer 7. Preferably, layer 9A comprises a silicon dioxide, silicon nitride or a silicon oxynitride layer having a thickness of about 300 to 1500 Angstroms. Layer 9A may be thermally grown on the active layer or deposited by chemical or physical vapor deposition, such as by plasma-activated chemical vapor deposition. Any other suitable layer thickness and materials may also be used. A photoresist pattern 10 is formed over the etch stop layer 9A. This pattern 10 is formed in the shape of a reverse bit line pattern. In other words, the photoresist 10 is removed in locations where the bit lines 13 will be subsequently formed.

The etch stop layer 9A is then selectively patterned using photoresist 10 as a mask. The etch stop layer is dry or wet etched using an etching gas or liquid which preferentially etches the material of the etch stop layer 9A compared to the material of the active layer 7. For example, if the etch stop layer 9A comprises silicon dioxide, silicon nitride or silicon oxynitride and the active layer 7 comprises polysilicon, then any etching gas or liquid which selectively etches silicon dioxide, silicon nitride or silicon oxynitride compared to polysilicon may be used. Preferably, the etching gas or liquid etches the material of the etch stop layer 9A at a rate that is least two times higher and more preferably at least four time higher than the material of the active layer 7. An example of an etchant gas mixture that results in such selectivities is $C_4F_8$ mixed with CO, Ar and $O_2$. Other gas combinations may also be used. The photoresist layer 10 is removed after the patterning step.

Figure 5:
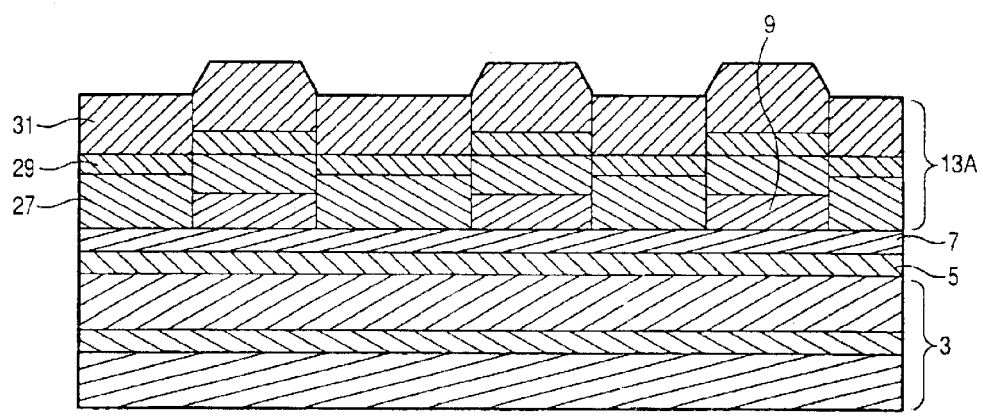

After the patterning step, the channel portions 11 of the active layer 7 are covered by the patterned etch stop layer 9, while the source and drain portions 15 of the active layer 7 are exposed, as shown in FIG. 5. A source/drain line film 13A is then formed over the patterned etch stop layer 9 and the exposed source drain portions 15 of the active layer 7 as shown in FIG. 5. The source/drain line film 13A is referred to as a bit line film if the thin film transistor is used in a memory device. The source/drain line film 13A comprises one or more conductive layers, such as the conductivity enhancing film 29 between heavily doped polysilicon layers 27, 31.

The source/drain line film 13A is then photolithographically patterned to form source and drain lines 13. For example, film 13A may be patterned using a bit line photoresist mask (not shown in the Figures). After patterning, portions of the patterned etch stop layer 9 are exposed between the source and drain lines 13, as shown in FIG. 1. Preferably, portions 19 of the source and the drain lines 13 are located on the patterned etch stop layer 9.

The source/drain line film 13A is selectively etched using an etching gas or liquid which preferentially etches the material of film 13A relative to the material of the etch stop layer 9. For example, if the source/drain film 13A comprises polysilicon and the etch stop layer 9 comprises silicon dioxide, silicon nitride or silicon oxynitride, then any etching gas or liquid which selectively etches polysilicon compared to silicon nitride or silicon oxynitride may be used. Preferably, the etching gas or liquid etches the material of the source/drain line film 13A at a rate that is least two times higher and more preferably at least four time higher than the material of the patterned etch stop layer 9. An example of an etchant gas mixture that results in such selectivities is HBr mixed with $Cl_2$, He and $O_2$. Other gas combinations may also be used.

Preferably, as seen in FIG. 5, the step of forming the source/drain line film 13A comprises forming a first heavily doped amorphous silicon layer 27 and forming a titanium layer 29A on the amorphous silicon layer 27. A titanium nitride layer 29B is formed on the titanium layer. For example, the titanium layer may be an about 100–500 Angstroms thick titanium layer deposited by physical vapor deposition (PVD) or ionized metal plasma PVD (IMP-PVD). The titanium nitride layer may be an about 100–200 Angstrom TiN layer deposited by PVD, IMP-PVD or metal organic chemical vapor deposition (MOCVD). However, any other suitable deposition methods and layer thickness may be used instead. The amorphous silicon layer and the titanium layer are then annealed, such as by rapid thermal annealing or laser annealing. During the annealing, the amorphous silicon layer 27 is converted to a polysilicon layer and the titanium layer is reacted with the underlying amorphous silicon layer to form a titanium silicide layer. Thus, a titanium nitride/titanium silicide conductivity enhancing bilayer film 29 is formed during the annealing step. Furthermore, during annealing, dopants are outdiffused from the heavily doped amorphous silicon layer into the active layer 7 to form source and drain regions 15 in the first active layer. After the annealing step, a second heavily doped polysilicon layer 31 is deposited on the titanium nitride layer 29. Layer thicknesses and doping concentrations of source/drain line polysilicon layers 31 and 27 may be similar to those of the gate line polysilicon layers 21 and 25, respectively. Polysilicon layers are preferably N-type doped to form N-type source and drain regions in the active layer by outdiffusion. This completes the array 1 shown in FIG. 1.

If desired, the array 1 may be formed as a monolithic three dimensional array 100, as shown in FIG. 2. Thus, a second insulating fill layer 37 is formed layer over and between the source and drain lines 13. The second fill layer 37 is planarized with a top surface of the first source and drain lines 13 by chemical mechanical polishing or etchback. A second active layer 107 is deposited over the first source and drain lines 13 and over the second fill layer 37. The second active layer is annealed to outdiffuse dopants from the second heavily doped polysilicon layer 31 of the source and drain lines 13 into the second active layer 107 to form source and drain regions 115 in the second active layer 107. A second gate insulating layer 105 is formed over the second active layer 107 and second gate lines 103 are formed over the second gate insulating layer 105. Thus, the top gate thin film transistors 133 are formed over bottom gate or inverted thin film transistors 33, as shown in FIG. 2.

To form additional device levels, alternating sets of inverted and top gate thin film transistors are formed over each other as described above. For example, to form a third device level containing inverted thin film transistors 233, a third insulating fill layer is formed over and between the second gate lines 103 in a manner similar to the first fill layer 35. The third fill layer is planarized to a top surface of the second gate lines 103. A third gate insulating layer 205 is formed over the second gate lines 103 and the third fill layer. A third active layer 207 is formed over the third gate insulating layer 205. A second etch stop layer 209 is formed over the third active layer 207. The second etch stop layer 209 is patterned such that channel portions 211 of the third active layer 207 are covered by the second etch stop layer 209 and source/drain portions 215 of the third active layer are exposed. A second source/drain line film is formed over the second patterned etch stop layer 209 and exposed portions 215 of the third active layer 207. The second source/drain line film is selectively patterned to form second source and drain lines 213 and to expose portions of the second patterned etch stop layer 209 between the second source and drain lines.

If desired, additional device levels, such as level 104 shown in FIG. 2, may be formed in the array 100. As discussed above, if it is desired to form charge storage transistors, then the gate insulating layers 5, 105 and 205 comprise a portion of a charge storage region.

The arrays 1, 100 of the preferred embodiments of the present invention may be used in nonvolatile flash memory devices such as EEPROMs and as non-flash EEPROMs (i.e., EEPROMs where each transistor is erased separately), UV erasable PROMs (EPROMs), mask ROMs, dynamic random access memories (DRAMs), liquid crystal displays (LCDs), field programmable gate arrays (FPGA) and microprocessors.

The foregoing description of the invention has been presented for purposes of illustration and description. It is not intended to be exhaustive or to limit the invention to the precise form disclosed, and modifications and variations are possible in light of the above teachings or may be acquired from practice of the invention. The drawings and description were chosen in order to explain the principles of the invention and its practical application. The drawings are not necessarily to scale and illustrate the array in schematic block format. It is intended that the scope of the invention be defined by the claims appended hereto, and their equivalents.

What is claimed is:

1. A monolithic, three dimensional array of thin film transistors, comprising:
   a first device level comprising a plurality of first inverted staggered thin film transistors; and
   a second device level monolithically formed over the first device level, the second device level comprising a plurality of second thin film transistors; and
   wherein the first inverted staggered thin film transistors comprise a first etch stop layer located over transistor channel regions.

2. The array of claim 1, further comprising:
   a plurality of first gate lines at a first height and extending in a first direction;
   a first planarized insulating fill layer located between the first gate lines;
   a first gate insulating layer located on the first gate lines and on the first insulating fill layer;
   a first active layer located on the first gate insulating layer;
   a patterned etch stop layer located on channel regions in the first active layer;
   a plurality of first source and drain lines located on source and drain regions in the first active layer and on portions of the patterned etch stop layer, the first source and drain lines extending in a second direction different from the first direction;
   a second active layer located on the first source and drain lines;
   a second gate insulating layer located on the second active layer;
   a plurality of second gate lines located on the second gate insulating layer, the second gate lines extending in the first direction.

3. The array of claim 2, wherein:
   the first and the second transistors share the first source and drain lines;
   the first device level comprises the first gate lines and the first source and drain lines; and
   the second device level comprises the second gate lines and the first source and drain lines.

4. The array of claim 3, wherein:
   the channel, source and drain regions of each first transistor are located in a portion of the first active layer;
   a gate insulating region of each first transistor is located in a portion of the first gate insulating layer;
   a gate electrode of each first transistor is located in a portion of one of the first gate lines;
   channel, source and drain regions of each second transistor are located in a portion of the second active layer;
   a gate insulating region of each second transistor is located in a portion of the second gate insulating layer;
   a gate electrode of each second transistor is located in a portion of one of the second gate lines; and
   each second transistor comprises a top gate staggered thin film transistor.

5. The array of claim 4, further comprising:
   a third gate insulating layer located on the second gate lines;
   a third active layer located on the third gate insulating layer;
   a second patterned etch stop layer located on the third active layer;
   a plurality of the second source and drain lines located on the third active layer and on the second patterned etch stop layer, wherein the plurality of second source and drain lines extend in a second direction different from the first direction; and
   a plurality of third inverted staggered thin film transistors.

6. The array of claim 5, wherein:
   the second and the third transistors share the second gate lines;
   channel, source and drain regions of each third transistor are located in a portion of the third active layer;
   a gate insulating region of each third transistor is located in a portion of the third gate insulating layer;
   a gate electrode of each third transistor is located in a portion of one of the second gate lines; and
   source and drain lines of each third transistor comprise the second source and drain lines.

7. The array of claim 6, wherein:
   the first gate lines comprise a heavily doped polysilicon layer over a metal suicide layer;
   the second gate lines comprise a metal suicide layer located between two heavily doped polysilicon layers;
   the first, second and third gate insulating layers comprise a portion of a charge storage region selected from a group consisting of: a dielectric isolated floating gate, an insulating layer containing conductive nanocrystals, and a composite dielectric film comprising a tunneling layer, a charge storage layer and a blocking oxide;
   the first, second and third active layers comprise a polysilicon layer;
   the etch stop layer comprises a material which can be selectively etched compared to polysilicon;
   the source and drain regions comprise heavily doped polysilicon regions; and
   the first and second source and drain lines comprise at least a first polysilicon layer.

8. The array of claim 7, wherein:
   the charge storage regions comprise the composite dielectric film comprising an oxide tunneling layer, a nitride charge storage layer, and the blocking oxide;

the etch stop layer comprises a silicon oxide, silicon nitride or a silicon oxynitride layer; and the first and the second source and drain lines comprise the first polysilicon layer contacting the source and drain regions of the first transistors, a titanium suicide layer contacting the first polysilicon layer, a titanium nitride layer contacting the titanium suicide layer and a second polysilicon layer contacting the titanium suicide layer.

9. The array of claim 6, wherein the first and second transistors comprise metal oxide semiconductor transistors of a first conductivity type and the third transistors comprise metal oxide semiconductor transistors of a second conductivity type.

10. The array of claim 1, wherein the first device level further comprises:

word line;

a charge storage region located above the word line;

an active layer located above the charge storage region;

the first etch stop layer patterned and located above a first portion of the active layer; and bit lines located over a portion of the first etch stop layer and over second portions of the active layer comprising the transistor channel regions.

11. The array of claim 1, wherein the first device level further comprises:

a plurality of gate lines;

a planarized insulating fill layer located between the gate lines;

gate insulating layer located over the fill layer and over exposed portions of the gate lines;

an active layer located over the gate insulating layer;

the first etch stop layer patterned and located over first portions of the active layer comprising the transistor channel regions; and a plurality of source and drain lines located over second portions of the active layer and over portions of the patterned first etch stop layer.

12. A method of making a monolithic, three dimensional array of thin film transistors, comprising:

forming a first device level comprising a plurality of first inverted staggered thin film transistors; and monolithically forming a second device level over the first device level, the second device level comprising a plurality of second thin film transistors; and wherein the first inverted staggered thin film transistors comprise a first etch stop layer located over transistor channel regions.

13. The method of claim 12, wherein the method of making the plurality of first inverted staggered thin film transistors comprises:

forming a first gate line layer;

patterning the first gate line layer to form a plurality of first gate lines;

forming a first insulating fill layer over and between the first gate lines;

planarizing the first fill layer with a top surface of the first gate lines;

forming a first gate insulating layer over exposed portions of the first gate lines and the first fill layer;

forming a first active layer over the first gate insulating layer;

forming the first etch stop layer over the first active layer;

selectively patterning the first etch stop layer such that first portions of the first active layer are covered by the patterned first etch stop layer which is located over the first portions of the first active layer, and second portions of the first active layer are exposed;

forming a first source/drain line film over the patterned first etch stop layer and the exposed second portions of the first active layer; and selectively patterning the first source/drain line film to form a plurality of first source and drain lines located over the second portions of the first active layer and over portions of the patterned first etch stop layer, and to expose portions of the patterned first etch stop layer between the first source and drain lines.

14. The method of claim 12, wherein the method of making the plurality of first inverted staggered thin film transistors comprises:

forming a word line;

forming a charge storage region located above the word line;

forming an active layer located above the charge storage region;

forming and patterning the first etch stop layer such that the first etch stop layer is located above a first portion of the active layer;

forming a bit line film above the patterned first etch stop layer and exposed second portions of the active layer; and selectively patterning the bit line film to form bit lines located over a portion of the first etch stop layer and over second portions of the active layer.

* * * * *